(12) United States Patent
Takeda et al.

(10) Patent No.: US 7,449,731 B2
(45) Date of Patent: Nov. 11, 2008

(54) SEMICONDUCTOR GATE CIRCUIT AND DELAY CIRCUIT COMPRISING SERIES CONNECTED CMOS TRANSISTORS

(75) Inventors: Hideo Takeda, Kawasaki (JP); Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/916,515

(22) Filed: Aug. 12, 2004

(65) Prior Publication Data

US 2005/0212013 A1      Sep. 29, 2005

(30) Foreign Application Priority Data

Mar. 24, 2004    (JP)    ............................. 2004-087755

(51) Int. Cl.
*H01L 27/092*    (2006.01)
(52) U.S. Cl. ................ 257/206; 257/208; 257/E27.062
(58) Field of Classification Search .................. 257/206, 257/204, 208, E27.062, E27.067
See application file for complete search history.

(56) References Cited

U.S. PATENT DOCUMENTS

| 5,229,667 | A |   | 7/1993 | Shimizu ..................... 307/605 |
| 5,302,871 | A | * | 4/1994 | Matsuzaki et al. .......... 327/288 |

FOREIGN PATENT DOCUMENTS

| JP | 2-174258 |   | 7/1990 |
| JP | 02-174258 | * | 7/1990 |
| JP | 2-174259 |   | 7/1990 |
| JP | 5-55881 |   | 3/1993 |
| JP | 2621612 |   | 4/1997 |

\* cited by examiner

*Primary Examiner*—Lynne A. Gurley
*Assistant Examiner*—Andrew O. Arena
(74) *Attorney, Agent, or Firm*—Staas & Halsey LLP

(57) ABSTRACT

A gate circuit has a complementary transistor structure comprising transistors of different conductivity types connected in series respectively between two power source terminals and an output terminal, sharing a gate connected to an input terminal, the transistors of different conductivity types each comprising plural transistors, and the plural transistors being connected in series between each of the two power source terminal and the output terminal. The gate is provided to extend like a line, plural diffusion layers are provided along the direction of the line in which the gate extends, and a conduction channel of each of the plural transistors connected in series between the power source terminals and the output terminal is formed in the diffusion layers.

10 Claims, 4 Drawing Sheets

SEMICONDUCTOR GATE CIRCUIT AND DELAY CIRCUIT COMPRISING SERIES CONNECTED CMOS TRANSISTORS

BACKGROUND OF THE INVENTION

1. Field of the Invention

The present invention relates to a gate circuit having a complementary transistor structure comprising transistors of different conductivity types connected in series respectively between two power source terminals and an output terminal, sharing a gate connected to an input terminal, the transistors of different conductivity types each comprising plural transistors, and the plural transistors being connected in series between each of the two power source terminal and the output terminal, and also relates to a delay circuit using the gate circuit.

2. Description of the Related Art

A known conventional delay circuit uses a gate circuit (inverter) based on a complementary transistor structure. FIG. 4 shows a first example of a gate circuit used in such a conventional delay circuit. FIG. 5 shows a mount (layout) structure of the same circuit. Further, the conventional delay circuit is constructed by connecting serially a plurality of gate circuits each shown in FIG. 4 (for example, see Patent Literature 1).

The layout shown in FIG. 5 is constructed including, for example: a P-type diffusion layer 3 provided in an N-well region 2 formed at a part of a P-type silicon substrate 1; an N-type diffusion layer 4 provided apart from the P-type diffusion layer 3, outside the N-well region; a gate 7 provided bridging the two diffusion layers 3 and 4 and having a connection via 6 formed in the center portion and connected to an input terminal (metal wire layer) 5; power source terminals (power source wire layer) 10 and 11 provided near the two ends of the gate 7 and connected to the diffusion layers 3 and 4 through connection vias 8 and 9; and an output terminal 14 as a metal wire layer which connects the two diffusion layers 3 and 4 to each other though connection vias 12 and 13.

Another (second) known example of the conventional delay circuit also uses a gate circuit (inverter) based on a complementary transistor structure. Each of transistors having different conductivity types and forming the complementary transistor structure is further constructed by plural transistors. These plural transistors are connected in series between a power source terminal and an output terminal. FIG. 6 shows a gate circuit used in such a delay circuit, and FIG. 7 shows a mount (layout) structure of the same circuit.

In contrast to the structure shown in FIG. 5, the layout structure shown in FIG. 7 is arranged such that a gate 7A bridging two diffusion layers 3 and 4 has two linear portions 7a and 7b. Conduction channels formed from electrodes Vdd and Vss to an output terminal 14 are formed in the direction of the widthwise distance between two gates arranged in parallel to each other in one diffusion layer (3 or 4), so that the conduction channel length is long. According to this structure where attention is focused on each of the transistors forming the complementary transistor structure, the ON-resistance of the gate is increased by connecting plural transistors in series from one power source terminal to the output terminal. The delay amount can thus be increased more than a normal gate circuit.

Patent Literature 1: Japanese Patent Laid-Open No. 4-94557 (page 2, FIGS. 2 and 5)

If a delay circuit is constructed with use of the gate circuit shown in FIG. 5 according to the prior art described above, it is necessary to use plural uniform gate circuits connected in series in order to ensure a delay amount. As a result, the circuit has a large size, so that the mount efficiency is lowered.

Alternatively, if a delay circuit is constructed with use of the gate circuit shown in FIG. 7, the delay amount of each gate circuit is greater than that in the circuit shown in FIG. 5. However, the delay circuits need a large size in the direction between the input and output. Further, if it is arranged within the distance width of the power source terminal (power source line), like the gate circuit shown in FIG. 5, the mount efficiency cannot be improved in the direction of the distance width. As a result, a great improvement in mount efficiency cannot be expected.

The present invention has been made to solve the above problems and has an object of providing a gate circuit capable of raising space efficiency by improving the mount density when a delay circuit is constructed with use of the gate circuit, and the delay circuit using the gate circuit.

SUMMARY OF THE INVENTION

To achieve the above object, according to the present invention, a gate circuit has a complementary transistor structure comprising transistors of different conductivity types connected in series respectively between two power source terminals and an output terminal, sharing a gate connected to an input terminal, the transistors of different conductivity types each comprising plural transistors, and the plural transistors being connected in series between each of the two power source terminal and the output terminal, wherein the gate is provided to extend like a line, plural diffusion layers are provided along the direction of the line in which the gate extends, and a conduction channel of each of the plural transistors connected in series between the power source terminals and the output terminal is formed in the diffusion layers.

Preferably, the gate extends like a straight line and crosses substantially at right angles a direction from an input side to an output side. Further preferably, the plural diffusion layers are connected by a metal wire, or the plural diffusion layers are connected (short-circuited) by a connecting diffusion layer.

According to another aspect of the present invention, a delay circuit comprises plural gate circuits connected in series, the plural gate circuits each being the gate circuit described above, or the delay circuit comprises an inverter provided in an output side of the gate circuit described above.

As described above, according to the present invention, the mount density can be improved both in the direction from the input side to the output side and in the direction between the power source terminals. Therefore, it is possible to provide a gate circuit and a delay circuit which can efficiently use spaces and allow manufacture of semiconductor devices with high mount efficiency.

DETAILED DESCRIPTION OF THE PREFERRED EMBODIMENTS

Embodiments of the present invention will now be described with reference to the drawings.

Embodiment 1

Figure 1:
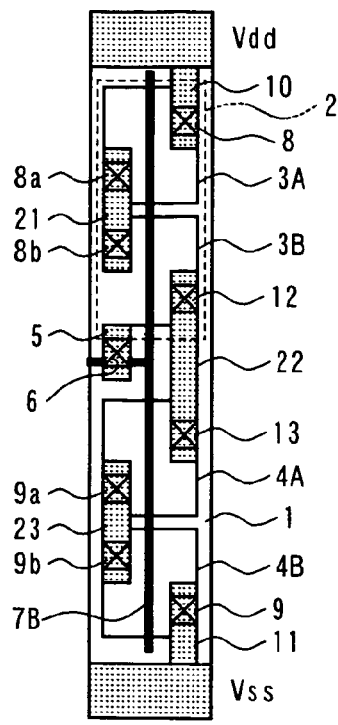
FIG. 1 is a plan cross-sectional view showing the embodiment 1 of the present invention.
Figure 6:
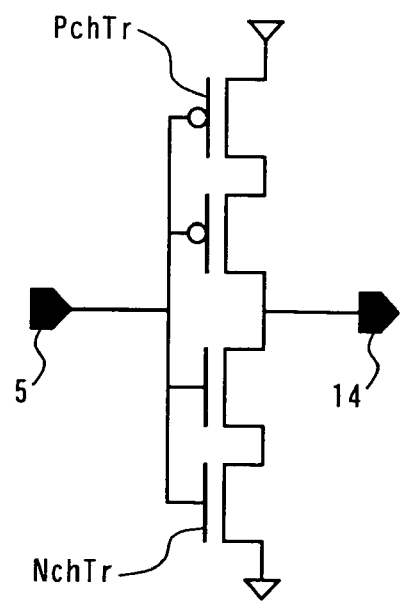
FIG. 6 is a circuit diagram showing the second example of the conventional gate circuit.

FIG. 1 is a plan sectional view showing a gate circuit according to the present invention. The circuit configuration of this gate circuit is equivalent to that shown in FIG. 6. The layout structure shown in FIG. 1 is constructed by, for example, including: two (or plural) P-type diffusion layers (first and second P-type diffusion layers) 3A and 3B provided apart from each other in an N-well region 2 formed at a part of a P-type silicon substrate 1; two (or plural) N-type diffusion layers (first and second N-type diffusion layers) 4A and 4B provided apart from each other in the other part of the P-type diffusion layer 1 than the N-well region; a gate 7B provided bridging all the plural P-type diffusion layers 3A and 3B and the N-type diffusion layers 4A and 4B and having a connecting via 6 provided in the center part of the gate 7B and connected to a metal wire layer to form an input terminal (input pin) 5; power source terminals (power source wire layers) 10 and 11 provided near the two ends of the gate 7B and connected to the diffusion layers 3A and 4B closest to the power source side, through connecting vias 8 and 9; and metal wire layers (first to third wire layers) 21, 22, and 23 which connect all the P- and N-type diffusion layers 3A, 3B, 4A, and 4B through connecting vias 8a, 8b, 9a, and 9b. The metal wire layer formed in the center part, i.e., the second wire layer 22 connecting the second P-type diffusion layer 3B and the first N-type diffusion layer 4A forms an output terminal (output pin).

In the structure described above, the gate 7B has a slightly shorter length than (but is substantially equal to) the distance between two power sources Vdd and Vss, that is, substantially the same width as that of the P-type silicon substrate 1. The plural diffusion layers 3A, 3B, 4A, and 4B are formed substantially over the whole length. In addition, the first and third wire layers 21 and 23 each of which connects the diffusion layers of an equal conductivity type, and the second wire layer (output terminal) 22 which connects the power source terminals 10 and 11 to the diffusion layers of different conductivity types (the second P-type diffusion layer and the first N-type diffusion layer) are formed on the surface respectively in opposite sides with respect to the gate 7B. Further, the first and second diffusion layers 3A and 3B and the gate 7B construct a transistor (Pch (PMOS) transistor) forming part of a complementary transistor structure. The third and fourth diffusion layers 4A and 4B and the gate 7B construct another one (Nch (NMOS) transistor) also forming part of the complementary transistor structure. Each of the transistors forming the complementary transistor structure is constructed by two transistors connected in series between the power source terminal 10 or 11 and the output terminal (second wire layer 22), sharing the gate 7B.

In the structure described above, with respect to a first predetermined gate voltage, a first conduction channel is formed from the Vdd power source terminal to the first wire layer 21, and a second conduction channel is formed from the first wire layer 21 to the second wire layer 22. With respect to a second predetermined gate voltage, a third conduction channel is formed from the Vss power source terminal to the third wire layer 23, and a fourth conduction channel is formed from the third wire layer to the second wire layer 22.

Figure 5:
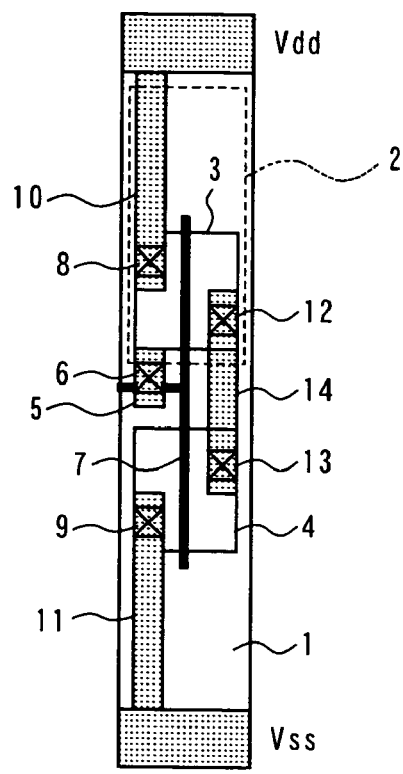
FIG. 5 is a plan cross-sectional view showing a layout structure of the gate circuit shown in FIG. 4.
Figure 7:
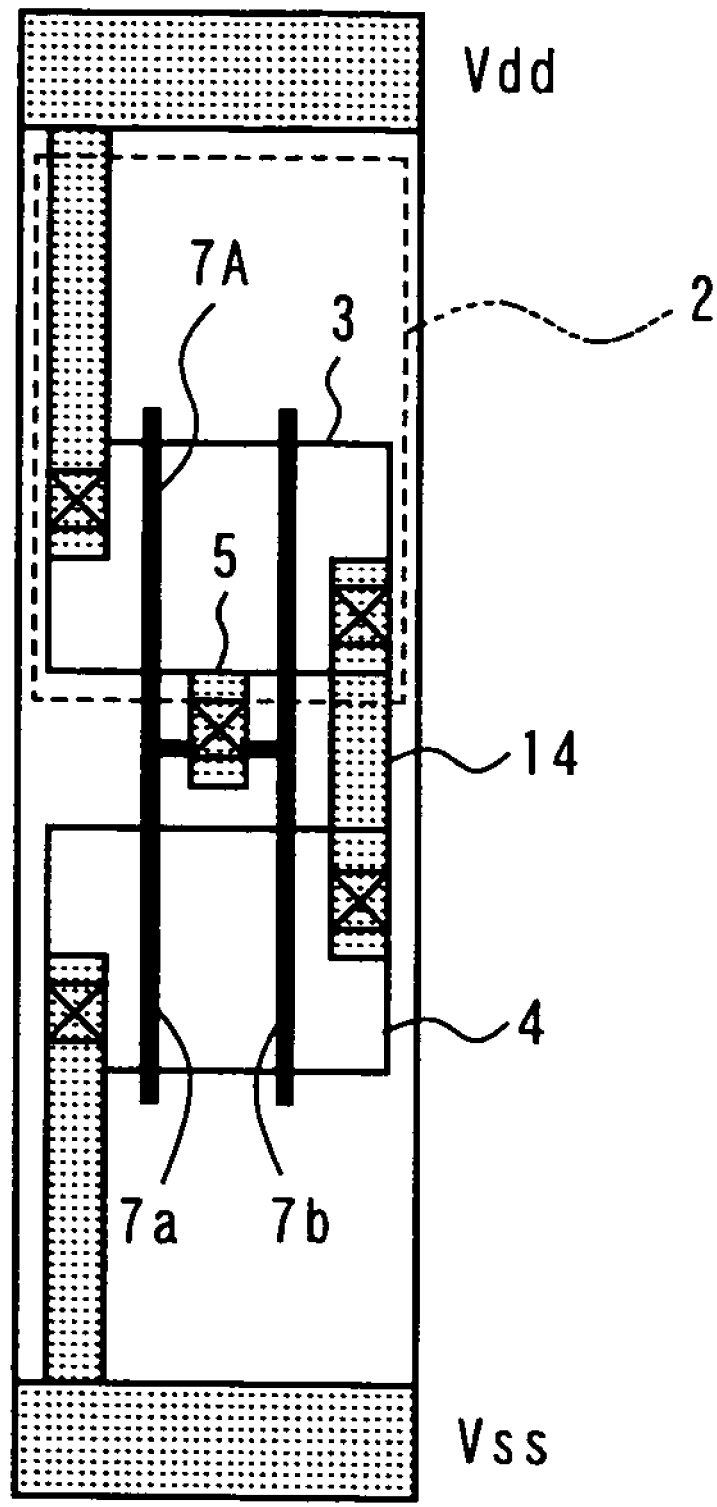
FIG. 7 is a plan cross-sectional view showing a layout structure of the gate circuit shown in FIG. 6.

Thus, the gate circuit according to the embodiment 1 can have an increased gate resistance even in a substantially equal space and can elongate the conduction channels, compared with the conventional gate circuit (first example) shown in FIG. 5. A greater delay amount can accordingly be ensured. In addition, the power consumption can be reduced. On the other side, the width can be reduced in the direction between the inputs and output, compared with the other conventional gate circuit (second example) shown in FIG. 7.

Embodiment 2

Figure 2:
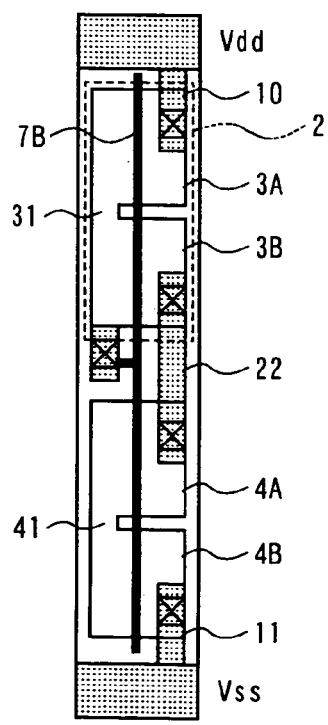
FIG. 2 is a plan cross-sectional view showing the embodiment 2 of the present invention.

In the embodiment 1, the respective diffusion layers are connected through metal wire layers. However, these layers can be connected (short-circuited) by diffusion layers. FIG. 2 is a plan cross-sectional view showing a gate circuit in this case. Connecting portions 31 and 41 of the diffusion layers 3A, 3B, 4A, and 4B are formed on the surface in the side opposite to the diffusion layer where the power source terminals 10 and 11 and the output terminal (second wire layer 22) are formed, with respect to the gate. According to this structure, the connecting portions can be formed simultaneously in the process of forming the diffusion layers. As a result, the wire layer forming process for connecting the diffusion layers 21 and 23 of one equal conductivity type (the first and third wire layers) can be omitted. A free space is thus created so that the wire property can be improved (e.g., another wire can be provided).

Embodiment 3

Figure 3:
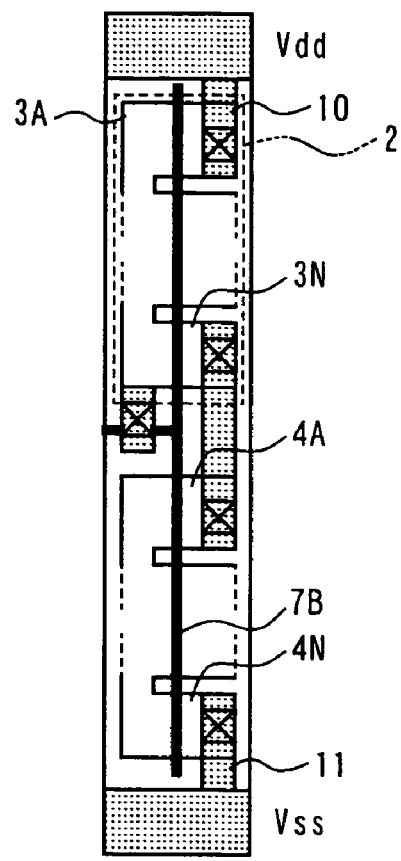
FIG. 3 is a plan cross-sectional view showing the embodiment 3 of the present invention.
Figure 4:
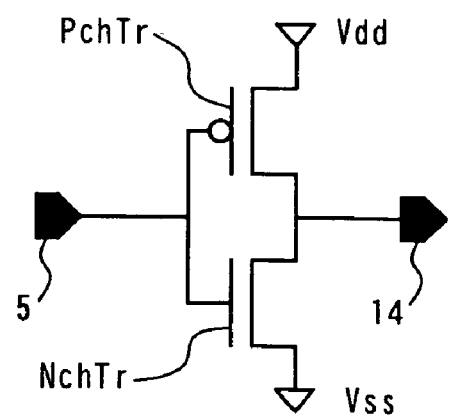
FIG. 4 is a circuit diagram showing the first example of a conventional gate circuit.

The embodiments 1 and 2 have been described with reference to the case where two diffusion layers form one transistor of a complementary transistor structure. However, the transistor may be formed of three or more diffusion layers. FIG. 3 shows a layout structure thereof. FIG. 3 shows the case where plural diffusion layers 3A to 3N and 4A to 4N are connected by diffusion layers like the case shown in FIG. 2. Needless to say, however, these plural diffusion layers may be connected (short-circuited) by metal wire layers as shown in FIG. 1.

Embodiment 4

It is also needless to say that any of the gate circuits according to the embodiments 1 to 3 may be provided in each of plural stages connected in series (cascade) to construct a delay circuit having a greater delay amount. Also, an inverter may be connected in series to any of the gate circuits according to the embodiments 1 to 3, to construct a delay circuit. According to these delay circuits, high mount density can be ensured, and a long delay time can also be ensured easily.

Although the foregoing embodiments have been described with reference to the case of a single well, the present invention is applicable to twin and triple wells in a similar manner. Also, the foregoing embodiments have been described with reference to the case of using a P-type silicon substrate. Needless to say, however, an N-type silicon substrate may be used instead.

What is claimed is:

1. A gate circuit having a complementary transistor structure comprising:

plural transistors of different conductivity types connected respectively between first and second power source terminals and an output terminal, said transistors sharing a gate connected to an input terminal, the input terminal disposed on an input side of the gate and the output terminal disposed on an output side of the gate, opposite to the input side;

wherein:

plural diffusion layers are disposed along a longitudinal direction from said first power source terminal to said second power source terminal;

each portion of said gate corresponding to each of said plural diffusion layers extends in the longitudinal direction, said gate having an overall length substantially equal to a distance from said first power source terminal to said second power source terminal, and a conduction channel of each of the plural transistors crosses the gate from the input side to the output side.

2. The gate circuit according to claim 1, wherein said gate extends like a straight line.

3. The gate circuit according to claim 1, wherein said gate extends like a straight line and crosses substantially at right angles a direction from an input side to an output side.

4. The gate circuit according to claim 1, wherein said plural diffusion layers are short-circuited by a metal wire.

5. The gate circuit according to claim 1, wherein said plural diffusion layers are short-circuited by a connecting diffusion layer.

6. A delay circuit comprising plural gate circuits connected in series, said plural gate circuits each being those defined by claim 1.

7. A delay circuit comprising an inverter provided in an output side of a gate circuit according to claim 1.

8. A method of forming a gate circuit, comprising:

providing a plurality of diffusion layers along a longitudinal direction from a first power source terminal to a second power source terminal;

providing a gate, each portion of said gate corresponding to each of said plural diffusion layers extending in the longitudinal direction;

providing an overall length of said gate substantially equal to a distance from said first power source terminal to said second power source terminal; and connecting a conduction channel of each of a plurality of transistors in series between the plurality of diffusion layers in the longitudinal direction of said gate;

wherein the conduction channel crosses the gate from an input side of the gate to an output side of the gate opposite to the input side.

9. A gate circuit comprising:

plural diffusion layers provided in a longitudinal direction along a gate from a first power source terminal to a second power source terminal;

each portion of said gate corresponding to each of said plural diffusion layers extending in the longitudinal direction, said gate having an overall length substantially equal to a distance from said first power source to said second power source, and a conduction channel of each of a plurality of transistors connected in series between said power source terminals and an output terminal in between the diffusion layers in the longitudinal direction;

wherein the conduction channel crosses the gate from an input side of the gate to an output side of the gate opposite to the input side.

10. A gate circuit comprising:

first and second diffusion layers having a first conductivity disposed in a longitudinal direction along a gate;

third and fourth diffusion layers having a second conductivity opposite to the first conductivity disposed in the longitudinal direction along the gate;

an input terminal disposed at an intermediate portion of the gate on an input side of the gate;

an output terminal disposed on a first via connecting the second and third diffusion layers on an output side of the gate opposite to the input side;

a first power source terminal disposed near a first end of the gate and connected to the first diffusion layer on the output side of the gate;

a second power source terminal disposed near a second end of the gate and connected to the fourth diffusion layer on the output side of the gate;

a second via connecting the first and second diffusion layers on the input side of the gate;

a third via connecting the third and fourth diffusion layers on the input side of the gate; and a conduction channel connecting the first and the second transistors in series from the first power source terminal, the conduction channel extending from the first power source terminal to the first diffusion layer, from the first diffusion layer to the second via, from the second via to the second diffusion layer, from the second diffusion layer to the first via, from the first via to the third diffusion layer, from the third diffusion layer to the third via, from the third via to the fourth diffusion layer, and from the fourth diffusion layer to the second power source terminal.

* * * * *